United States Patent
McFarland et al.

(10) Patent No.: US 7,192,860 B2
(45) Date of Patent: Mar. 20, 2007

(54) HIGHLY SELECTIVE SILICON OXIDE ETCHING COMPOSITIONS

(75) Inventors: John A. McFarland, Scottsdale, AZ (US); Michael A. Dodd, Chandler, AZ (US); Wolfgang Sievert, Wunstorf (DE)

(73) Assignee: Honeywell International Inc., Morristown, NJ (US)

( * ) Notice: Subject to any disclaimer, the term of this patent is extended or adjusted under 35 U.S.C. 154(b) by 251 days.

(21) Appl. No.: 10/817,563

(22) Filed: Apr. 2, 2004

(65) Prior Publication Data

US 2004/0192046 A1    Sep. 30, 2004

Related U.S. Application Data

(63) Continuation-in-part of application No. 10/176,278, filed on Jun. 20, 2002, now abandoned.

(51) Int. Cl.
*H01L 21/44* (2006.01)
(52) U.S. Cl. ............... 438/612; 438/745; 438/756; 252/79.3
(58) Field of Classification Search ........ 438/689, 438/745, 746, 612, 756; 252/79.3, 79.4
See application file for complete search history.

(56) References Cited

U.S. PATENT DOCUMENTS

| 5,277,835 | A | * | 1/1994 | Ohmi et al. ............. 252/79.3 |
| 5,496,485 | A | * | 3/1996 | Maternaghan ........... 252/79.3 |
| 5,824,601 | A | | 10/1998 | Dao et al. ................ 438/713 |
| 6,117,796 | A | | 9/2000 | Gale et al. ............... 438/756 |
| 6,150,282 | A | | 11/2000 | Rath et al. ............... 438/745 |
| 6,192,488 | B1 | | 2/2001 | Li ........................... 134/1.3 |
| 6,192,899 | B1 | * | 2/2001 | Li et al. .................... 134/1.3 |
| 6,200,891 | B1 | | 3/2001 | Jagannathan et al. ..... 438/622 |
| 6,254,796 | B1 | | 7/2001 | Rath et al. ................. 216/87 |
| 2002/0037820 | A1 | * | 3/2002 | Small et al. ............... 510/175 |
| 2003/0235986 | A1 | | 12/2003 | Sievert et al. |
| 2004/0250835 | A1 | * | 12/2004 | Yates ......................... 134/3 |

FOREIGN PATENT DOCUMENTS

| GB | 1 228 083 | 4/1971 |
| JP | 59184532 | 10/1984 |
| JP | 02216126 | 8/1990 |
| JP | 10036140 | 2/1998 |
| WO | WO 00/58208 | 5/2000 |

* cited by examiner

*Primary Examiner*—T. N. Quach

(57) ABSTRACT

Silicon oxide etching solutions containing the product of at least one bifluoride source compound dissolved in a solvent consisting of at least one carboxylic acid, and further comprising from about 0.5 to about 3 percent by solution weight of hydrofluoric acid and from about 1 to about 5 percent by solution weight of water, wherein the total concentration of bifluoride source compound is between about 1.25 and about 5.0 moles per kilogram of solvent. Methods for selectively removing silicon oxides and metal silicates from metal surfaces are also disclosed.

23 Claims, No Drawings

HIGHLY SELECTIVE SILICON OXIDE ETCHING COMPOSITIONS

CROSS-REFERENCE TO RELATED APPLICATION

The present application is a Continuation-In-Part of U.S. patent application Ser. No. 10/176,278 filed Jun. 20, 2002, abandoned.

FIELD OF THE INVENTION

The present invention relates to etching compositions having reduced water content for the selective removal of silicon oxides from metal surfaces. In particular, the present invention relates to reduced water content solutions of a bifluoride source compound in a carboxylic acid, and methods for providing selective removal of silicon oxides using these solutions.

BACKGROUND OF THE INVENTION

The circuitry on a semiconductor chip has to connect with other circuits. These may be chips or display devices, transducers or electromechanical devices. Each of these situations will require the imposition of circuitry to interface the chip to the external environment. This interface is supplied by bonding pads.

Physically, bonding pads are the squares of metal, typically aluminum, generally 100 to 150 microns square, that are connected to the pins of the semiconductor package with bonding wires. Bonding pads are normally positioned near to the chip edge. Toward the end of the semiconductor fabrication process, passivation coatings are applied to protect the fabricated device. Silicon oxide films are typically deposited, often pyrolytically, using layers of oxides such as oxynitride, silicon dioxide, phosphorus-silicate-glass, boron-phosphorus-silicate-glass, and the like.

Following deposition the silicon oxide must be removed from the bonding pad so that the fabricated device can interconnect with other circuits. An etching composition is typically employed to remove the passivation coating.

Conventional passivation etchants contain ammonium fluoride, acetic acid, water and additional additives such as ethylene glycol or aluminum acetate. Current processes seek to over-etch the bonding pads to ensure complete elimination of the silicon oxide passivating coating. Over-etching with current products results in significant roughing and pitting of the bonding pad surfaces, creating poor contact points to the detriment of device reliability because current products also attack underlying metal surfaces. The products are known to dissolve pads completely, increasing the manufacturing yield loss.

There exists a need for a selective silicon oxide passivation coating etchant that does not attack underlying metal surfaces.

DETAILED DESCRIPTION OF THE PREFERRED EMBODIMENTS

This need is met by the present invention. It has now been discovered that products containing bifluoride species will etch silicon oxide films without attacking or corroding underlying metals, including aluminum, even with extended exposure when the water content is kept to a minimum. It has further been discovered that minor amounts of water and hydrofluroric acid, when added to bifluoride species, improve the selectivity of etching compositions for silicon over aluminum to the extent that no appreciable corrosion or reduction of aluminum film thickness occurs upon prolonged exposure. Until now, it was believed that the presence of any hydrofluoric acid was detrimental to such etch selectivity. The present invention thus provides an etching composition that can be used to over-etch silicon oxide containing passivating coatings from the metal surfaces of bonding pads without roughing or pitting the surface or dissolving the pad completely, and to etch vias in inter-layer insulation glasses.

Therefore, according to one aspect of the present invention, a silicon oxide etching solution is provided in which at least one bifluoride source compound is dissolved in a carboxylic acid solvent and which further includes from about 0.5 to about 3 percent by solution weight of hydrofluoric acid and from about 1 to about 5 percent by solution weight of water, wherein the total bifluoride source compound concentration is between about 1.25 and about 5 moles per kilogram of solvent.

Among the preferred bifluoride source compounds are ammonium fluoride and ammonium bifluoride, with solutions of ammonium fluoride and ammonium bifluoride in acetic acid being particularly preferred. These solutions may be prepared by adding acid anhydrides, such as acetic anhydride, to aqueous solutions of ammonium fluoride or ammonium bifluoride so that the acid anhydrides react with the water to dehydrate the solution and form the corresponding carboxylic acids.

The etching compositions are preferably essentially free of carboxylic acid amides, which is defined as a solution in which the level of any carboxylic acid amide present is insufficient to reduce the etching rate of the composition more than five percent. Preferably, the level of carboxylic acid amide should be undetectable. Such etching compositions that are essentially free of carboxylic acid amides may be prepared by the methods described in parent U.S. patent application Ser. No. 10/176,278.

The etching compositions of the present invention exhibit high selectivity to silicon oxide coatings, and do not corrode underlaying metal layers, even with extended exposure. The compositions do not attack metal, and do not promote galvanic etching.

The present invention thus provides etching compositions that can be used in semiconductor fabrication to remove by over-etching the silicon oxide passivating coatings that are formed on bonding pad surfaces, without roughing or pitting the pad surfaces or otherwise dissolving the pad. However, this is but one use for the etching compositions of the present invention, which may be used to selectively remove silicon oxides from essentially any metal surface. For example, the etching compositions can also be used to open semiconductor vias for subsequent metal deposition, or to remove silicon oxide deposits from bonding pads that form as a consequence of essentially any semiconductor fabrication process step, including reactive ion etching process steps.

Therefore, according to another aspect of the present invention, a method is provided for selectively removing silicon oxides from metal surfaces by contacting metal surfaces having silicon oxides thereon with an etching composition according to the present invention for a period of time effective to remove at least a portion of the silicon oxides. The methods of the present invention are suitable for use with metal surfaces formed from aluminum, copper, tungsten, tin, titanium, nickel, vanadium, lead and the like. Methods are preferred in which the silicon oxides are essentially completely removed, and methods in which the silicon oxide is removed from a semiconductor bonding pad or to open a via are particularly preferred.

It has further been discovered that the etching compositions of the present invention exhibit high selectivity to metal silicates such as titanium silicates and aluminum silicates that are formed by various plasma etching processes, and do not attack underlying metal layers or organic dielectric coatings, even with extended exposure. Therefore, according to yet another aspect of the present invention, a method is provided for selectively removing metal silicates from metal surfaces by contacting the surfaces with an etching composition according to the present invention for a period of time effective to remove at least a portion of the silicates. Again, methods are preferred in which the metal silicates are essentially completely removed. The metal surfaces include metal surfaces at least partially coated with at least one organic dielectric compound.

In addition, for purposes of the present invention, the terms "film," "coating" and "layer" are used interchangeably, regardless of whether each is applied as a deliberate step in a process of semiconductor fabrication or as a consequence of the performance of a semiconductor fabrication processing step. "Silicon oxides" refer to the various oxides, including silicon dioxides that are formed by various semiconductor layer or coating fabrication processes, including plasma etching and plasma deposition processes.

The etching compositions of the present invention are solutions of at least one bifluoride source compound, hydrofluoric acid and water in a carboxylic acid solvent. The carboxylic acid solvent may be a single carboxylic acid or a mixture of two or more carboxylic acids. For purposes of the present invention, carboxylic acids are defined as including mono-, di- and tricarboxylic acids; esters, amides and any unreacted residual anhydrides thereof; as well as amino acids and halogenated carboxylic acids. Monocarboxylic acids are preferred. In addition, carboxylic acid compounds having from zero to five carbon atoms in addition to the carboxylate carbon(s) are preferred, with acetic acid being most preferred. More than one carboxylic acid may be used, but, as is readily understood by those skilled in the art, when an acidic proton is needed to form the biflouride species, at least one carboxylic acid must contain an acidic proton.

The bifluoride source compounds of the present invention form bifluoride species [$(HF_2)^-$] when dissolved in the carboxylic acids of the inventive etching compositions. Bifluoride source compounds that form bifluoride species in this manner are readily identified by those skilled in the art without undue experimentation. Examples of such compounds include ammonium fluoride, ammonium bifluoride, fluoroborates, fluoroboric acid, tin bifluoride, antimony fluoride, tetrabutylammonium tetrafluoroborate, aluminum hexafluoride, and the like. More than one carboxylic acid or bifluoride source compound may be employed. Hydrogen fluoride acid addition and quaternary salts of organic nitrogen-containing compounds are also bifluoride source compounds. These include acid addition and quaternary salts of aliphatic amines, aromatic amines and nitrogen-containing heterocyclic compounds. The amines include primary, secondary and tertiary amines.

Ammonium fluoride and ammonium bifluoride are among the preferred bifluoride source compounds. Two moles of ammonium fluoride combine with one mole of a monocarboxylic acid, such as acetic acid, to form one mole of ammonium bifluoride and one mole of ammonium acetate (a carboxylic acid species), as shown below:

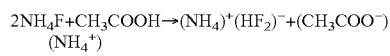

This is shown to illustrate how bifluoride species are formed in a carboxylic acid solution, and is not meant in any way to limit the invention to combinations of $NH_4F$ and acetic acid. However, this is among the particularly preferred embodiments of the present invention. An equally preferred embodiment directly dissolves ammonium bifluoride in one or more carboxylic acids.

Silicon oxide etching rates increase as the bifluoride source compound concentration increases, without adversely affecting the selectivity for silicon oxides over metals. A total bifluoride source compound concentration between about 1.75 and about 3.75 moles per kilogram of solvent is preferred. Examples of etching compositions of the present invention containing ammonium fluoride and acetic acid include compounds containing from about 5% to about 14% by solution weight ammonium fluoride. From about 7%, to about 11% by solution weight ammonium fluoride is preferred, with about 9% by solution weight being more preferred. Such compositions will also contain from about 1.5% to about 5% by solution weight water, with from about 2% to about 3% by solution weight water being preferred, and from about 0.5% to about 3% by solution weight hydrofluoric acid, with from about 1% to about 2.5 % by solution weight hydrofluoric acid being preferred.

The etchant compositions of the present invention are prepared by combining a stoichiometric quantities of the one or more carboxylic acids and the one or more bifluoride source compounds, which are mixed until the one or more bifluoride source compounds dissolve in the carboxylic acid(s). The water and hydrofluoric acid are then added with further mixing until all components dissolve. The hydrofluoric acid is typically added as an aqueous 49% hydrofluoric acid solution.

Alternatively, one or more acid anhydrides are added to an aqueous solution of at least one bifluoride source compounds to form upon contact with water at least one of the carboxylic acids intended for use in the etching compositions. One or more of the carboxylic acids may be present in the aqueous bifluoride source compound solution, provided that enough acid anhydride is stoichiometrically employed to attain the desired reduction in water content. This combination is then mixed until the acid anhydride(s) hydrolyze(s) and the bifluoride source compound(s) dissolve(s). Aqueous 49% hydrofluoric acid and any further water are then added with further mixing until all components dissolve.

For compositions containing more than one carboxylic acid, more than one acid anhydride may be used to dehydrate the aqueous bifluoride source compound solution, to form carboxylic acids intended for use in the etching composition upon contact with the water, even when the corresponding carboxylic acids are already present in the aqueous solution. Alternatively, one of the intended carboxylic acids may be added as an acid anhydride, while the other(s) are present as carboxylic acid(s) in the aqueous solution.

Thus, for etching compositions containing acetic acid, acetic anhydride is used, and so forth. The concentration of the bifluoride source compound in the aqueous solution is selected to provide the desired concentration of bifluoride source compounds and water in the inventive composition upon reaction of the acid anhydride with the water to form the carboxylic acid solvent.

The reaction is exothermic, requiring the removal of, rather than the addition of, thermal energy. The reaction runs to completion within about six hours. The conditions and apparatus for preparing the compositions of the present invention by this method are essentially conventional and require no further description.

The preparation of a solution of ammonium fluoride in acetic acid by adding acetic anhydride to an aqueous solution of ammonium fluoride is preferably performed under controlled temperature conditions. In particular, the reaction temperature is preferably maintained below 40° C. to avoid the formation of acetamide as a by-product formed by a reaction that occurs between the ammonium moiety and the anhydride at higher temperatures. A temperature between about 10 and about 40° C. is preferred, with a temperature between about 20 and about 30° C. even more preferred.

The formation of acetamide is undesirable because it slows the etching rate and tends to fog silicon wafer surfaces. Reaction temperatures should be controlled for essentially any reaction between ammonium fluoride and an acid anhydride to prevent the formation of undesirable acid amides that in general slow the rate of etching.

The acid anhydride addition to the aqueous bifluoride source compound should be slowly apportioned to allow the initial reaction between the water and the anhydride to occur before adding additional anhydride. This will maximize dehydration of the solution and, for reactions between ammonium fluoride and acid anhydrides, minimize acid amide formation by preventing excessive heat from being locally generated that would otherwise result in over-heating of the reaction mixture.

In yet another alternate method, the compositions of the present invention prepared by combining ammonium fluoride with hydrofluoric acid, acetic acid and/or acetic anhydride and water to form ammonium bifluoride and ammonium acetate can be prepared by the method disclosed in WO 00/58,208. For example, stoichiometric quantities of anhydrous gaseous or liquid hydrogen fluoride and anhydrous gaseous or liquid ammonia can be added to a stoichiometric amount of a carboxylic acid to obtain the mixture of ionic species that would otherwise form by reacting ammonium fluoride with a carboxylic acid, i.e., ammonium bifluoride and ammonium carboxylate, and then adding hydrofluoric acid. Employment of the proper stoichiometric quantities of hydrogen fluoride, ammonia gas and carboxylic acid in the processes described by this publication will result in the desired concentrations of ammonium bifluoride, ammonium carboxylate and hydrofluoric acid. Furthermore, the process permits the concentrations of ammonium fluoride, carboxylic acid, hydrofluoric acid and water, to be prepared with pinpoint accuracy.

The methods of the present invention for selectively removing silicon oxides from metal surfaces are performed by employing the inventive compositions in conventional etching and cleaning processes that require no further description. The processes are typically carried out at temperatures between about 20 and about 50° C., and preferably from about 20 to about 30° C.

As noted above, the methods of the present invention may be used to selectively remove silicon oxides from essentially any metal surface. Thus, the inventive methods and compositions may be used to remove silicon oxides from semiconductor bonding pads, including silicon oxide coating layers that have been applied as passivation coatings, and silicon oxide deposits that have formed during semiconductor fabrication process steps, including the process steps of reactive ion etching. In addition, the compositions and methods may be used to remove silicon oxides to open semiconductor vias for subsequent metal deposition. The compositions of the present invention are ideally selective in the removal of silicon oxides from aluminum surfaces, and may thus be used not only to remove silicon oxides from aluminum bonding pads, but also to remove the silicon oxide deposits that form on the anodized aluminum parts of sputtering equipment and gaseous deposition equipment used for the reactive ion etching of semiconductor devices.

The methods of the present invention for selectively removing metal silicates from metal surfaces similarly employed the inventive compositions in conventional cleaning processes that require no further description. These processes are also typically carried out at essentially the same temperatures.

The metal silicates typically form on metal surfaces as a consequence of plasma etching processes. Typically, aluminum silicates or titanium silicates form on aluminum and titanium surfaces, respectively. The compositions of the present invention will remove the metal silicates without attacking the underlying metal. The compositions will also not attack any organic dielectric coating that may be formed on the metal surfaces.

The following non-limiting examples are presented to further illustrate the present invention.

EXAMPLES

Example 1

A 9.4 lb. quantity of an etching composition according to the present invention was prepared by adding 1.078 lbs. of ammonium fluoride powder to 7.097 lbs. of 99% acetic acid with mixing. Mixing continued for two hours, after which 0.224 lbs. of aqueous 49% hydrofluoric acid and 0.18 lbs deionized water was added. Mixing continued for thirty minutes, after which the resulting solution was bottled.

The final composition was 11.58% ammonium fluoride, 2.39% hydrofluoric acid, 1.91% water and 84% acetic acid.

The etching composition was contacted with the aluminum bonding pads of a semiconductor device that were coated with silicon oxides as a passivation layer. The device included exposed aluminum surfaces. The etching solution was contacted until the silicon oxides were completely removed from the bonding pad. There was no detectable removal of aluminum from the bonding pads or the exposed aluminum surfaces.

Example 2

Example 1 was repeated using 48 lbs. ammonium fluoride, 356 lbs. 99% acetic acid, 12 lbs. aqueous 49% hydrofluoric acid and 8.5 lbs. water.

In this disclosure, there are shown and described only the preferred embodiments of the invention. It is to be understood that the invention is capable of use in various other combinations and environments and is capable of changes or modifications within the scope of the inventive concept as expressed herein.

What is claimed is:

1. A silicon oxide etching solution comprising the product of at least one bifluoride source compound dissolved in a solvent consisting of one or more carboxylic acids, and further comprising from about 0.5 to about 3 percent by solution weight of hydrofluoric acid and from about 1 to about 5 percent by solution weight of water, wherein the total bifluoride source compound concentration is between about 1.25 and about 5.0 moles per kilogram of solvent.

2. The solution of claim 1, comprising the product of a monocarboxylic acid having from 0 to five carbon atoms in addition to the carboxylate carbon.

3. The solution of claim 2, wherein said monocarboxylic acid is acetic acid.

4. The solution of claim 1, wherein at least one bifluoride source compound is selected from the group consisting of ammonium fluoride, ammonium bifluoride, fluoroborates, fluoroboric acid, tin bifluoride, antimony fluoride, tetrabutylammonium tetrafluoroborate, aluminum hexafluoride, hydrogen fluoride acid addition and quaternary salts of organic nitrogen-containing compounds and mixtures thereof.

5. The solution of claim 4, wherein a bifluoride source compound is ammonium fluoride, or ammonium bifluoride.

6. The solution of claim 5, consisting of the product of from about 7% to about 14% by solution weight ammonium fluoride, from about 1.5% to about 5% by solution weight water, from about 0.5% to about 3% by solution weight hydrofluoric acid and acetic acid.

7. The solution of claim 4, wherein said organic nitrogen-containing compounds are selected from the group consisting of aliphatic amines, aromatic amines and nitrogen-containing heterocycles.

8. A method for selectively removing silicon oxides from metal surfaces comprising contacting a metal surface having silicon oxides thereon with the etching solution of claim 1 for a period of time effective to remove at least a portion of said silicon oxides.

9. The method of claim 8, wherein said contacting step is performed on said surface until essentially all of said silicon oxides have been removed.

10. The method of claim 8, wherein said metal surface comprises one or more metals selected from the group consisting of aluminum, copper, tungsten, tin, titanium, nickel, vanadium and lead.

11. The method of claim 10, wherein said metal surface consists essentially of aluminum.

12. The method of claim 8, wherein said silicon oxides are removed from a semiconductor bonding pad surface.

13. The method of claim 12, wherein said bonding pad surface consists essentially of aluminum.

14. The method of claim 13, wherein said silicon oxides were applied to said bonding pad surface as a passivation coating.

15. The method of claim 8, wherein said silicon oxides are removed from a metal surface to open a via in a semiconductor device.

16. The method of claim 8, wherein said silicon oxides are removed from the metal parts of equipment used for the reactive ion etching of semiconductor devices.

17. The method of claim 16, wherein said metal parts have anodized aluminum surfaces.

18. The method of claim 16, wherein said metal parts are used in sputtering equipment or gaseous deposition equipment.

19. The method of claim 8 wherein said etching solution comprises the product of a bifluoride source compound and a monocarboxylic acid, hydrofluoric acid and water.

20. A method for selectively removing metal silicates from metal surfaces comprising contacting a metal surface having a silicate of said metal formed thereon with the etching solution of claim 1 for a period of time effective to remove at least a portion of the metal silicate.

21. The method of claim 20, wherein said metal is titanium or aluminum.

22. The method of claim 20, wherein said metal surface is at least partially coated with at least one organic dielectric.

23. The method of claim 20, wherein said contacting step is performed until essentially all of said metal silicate has been removed.

* * * * *